United States Patent [19]

Hickernell et al.

[11] Patent Number: 4,668,909
[45] Date of Patent: May 26, 1987

[54] PIEZOELECTRIC MATERIAL TESTING METHOD AND APPARATUS

[75] Inventors: Frederick S. Hickernell, Phoenix, Ariz.; Michael D. Adamo, Wilbraham, Mass.; Frederick Y. T. Cho, Scottsdale, Ariz.

[73] Assignee: The United States of America as represented by the Secretary of the Air Force, Washington, D.C.

[21] Appl. No.: 607,089

[22] Filed: May 4, 1984

[51] Int. Cl.[4] ............................................. G01R 29/22
[52] U.S. Cl. .................................... 324/56; 73/DIG. 4
[58] Field of Search ............................ 324/56, 109, 96; 333/149, 150, 144; 250/225; 29/25.35; 73/DIG. 4; 356/33, 364

[56] References Cited

U.S. PATENT DOCUMENTS

| 2,799,789 | 7/1957 | Wolfskill | 310/9 |
| 3,840,825 | 10/1974 | Gerard | 333/144 |
| 3,958,161 | 5/1976 | Dixon | 29/25.35 X |
| 3,959,747 | 5/1976 | Turski et al. | 333/149 |
| 4,296,086 | 10/1981 | Whitehead | 423/392 |
| 4,442,574 | 4/1984 | Wanuga et al. | 29/25.35 |
| 4,464,639 | 8/1984 | Staples | 29/25.35 X |

OTHER PUBLICATIONS

Grenier, Crystal Resonance Frequency Measurement by Phase Detection, 7-1970, pp. 15-19.

Primary Examiner—Reinhard J. Eisenzopf
Assistant Examiner—Jack B. Harvey
Attorney, Agent, or Firm—Gerald B. Hollins; Donald J. Singer

[57] ABSTRACT

An arrangement for testing substrate material intended for use in surface acoustic wave devices such as delay lines; the arrangement includes a plurality of electrical and physical evaluations of the material in quantities suitable for a manufacturing environment. In one evaluation acoustic wave energy developed in a tooling jig mounted transducer is mechanically coupled to successive material samples and the resulting output waveforms compared to expected results while in other evaluations the polarized light indicia and chemical reagent determined properties of the material samples are considered.

20 Claims, 2 Drawing Figures

PIEZOELECTRIC MATERIAL TESTING METHOD AND APPARATUS

RIGHTS OF THE GOVERNMENT

The invention described herein may be manufactured and used by or for the Government of the United States for all governmental purposes without the payment of any royalty.

CROSS REFERENCE TO RELATED APPLICATIONS

This application is one of a group of three filed on the same date concerning somewhat related inventions. The other two applications are identified as Ser. No. 06/607,094 and Ser. No. 06/607,087.

BACKGROUND OF THE INVENTION

This invention relates to the field of piezoelectric material testing, and is concerned with evaluating the physical and electrical properties of piezoelectric materials. The invention also relates to the selection of desired fragments from a sample lithium niobate piezoelectric material for satisfactory manufacture of surface acoustic wave (SAW) signal delay lines.

In manufacturing SAW delay lines presently accepted practice contemplates the fabrication of one or more test delay lines on a sample of substrate material taken from each production lot that is considered for manufacturing use; the successful performance of these test delay lines is assumed to predict satisfactory properties in the substrate material for larger quantity manufacture of the SAW delay line devices. A further practice in this current manufacturing is to assume that if piezoelectric wafers pass through the manufacturing steps of electrically poling, sawing into wafers, and surface polishing without incurring fracture or other physical damage, then the wafers came from a desirable boule of substrate material. In essence, this boot strap selection process relies on accumulated experience with wafers from a particular boule for determining suitability of that boule for continued use.

The importance of signal delay lines in signal correlation and signal processing applications both in military and commercial electronic equipment clearly suggests that improved testing and selection for delay line substrate materials are needed. The improvement of the boot-strap boule testing described above, will significantly advance the art of delay line manufacture and give rise to decreased cost, increased reliability, and increased predictability of manufactured device characteristics.

The patent of Henry M. Gerard, U.S. Pat. No. 3,840,825, discloses a coupling arrangement for communicating surface acoustic wave energy between adjacent bodies of propagating material. The Gerrard patent contemplates the fabrication of SAW delay line devices from two different materials in order that the desirable properties of each contribute to the delay line characteristics properties minimal compromise by the less desirable properties. In the Gerrard invention, an acoustic wave guide film is used to conduct SAW energy around the epoxy resin adhesive used to join two different substrate materials. The acoustic wave guide film of Gerard is fabricated from such materials as gold, aluminum or nickel which have desirable slow SAW propagating characteristics. This film is selected in thickness and shape to optimize SAW energy transfer and minimize loss and reflection problems.

The patent of Sygmond Turski, U.S. Pat. No. 3,959,747, discloses a surface acoustic wave device fabricated on a lithium niobate substrate and employing a particular metallization and bonding pad fabrication.

The patent of Shusuke Ono, U.S. Pat. No. 4,236,095, discloses a surface acoustic wave structure which also employs two different acoustic materials and an acoustic coupling between the materials. The Ono patent is incorporated by reference herein for, inter alia, its discussion of acoustic coupling technology.

SUMMARY OF THE INVENTION

An object of the present invention is to provide a method for selecting material having properties suitable for the manufacture of piezoelectric devices.

A second object of the invention is to provide a new and multifaceted inspection procedure for piezoelectric materials such as lithium niobate.

Another object of the invention is to provide an apparatus for selecting boules of substrate material having properties desirable for the functioning of surface acoustic wave devices.

DETAILED DESCRIPTION

The word "boule" is well known in the piezoelectric and other crystal arts and is considered herein to indicate a lump of material, of cylindrical or other shape, possibly suitable for division into wafers that display piezoelectric properties. The term "poling" is also well known in the piezoelectric art and refers generally to arrangement of the electric field domains in a piezoelectric material into a uniform and organized pattern. Poling is usually accomplished by subjecting a boule of piezoelectric material to an electric field in a hot oil bath.

The preferred embodiment description of the invention, involves surface acoustic wave delay lines fabricated on lithium niobate structures which are Y-cut, Z-propagating, single-crystal substrates. It is, of course, possible to substitute other material and other properties for these specific properties; for example, the single crystal piezoelectric materials $LiTaO_3$, $SiO_2$, $Bi_{12}SiO_{20}$, GaAs, $Bi_{12}GeO_{20}$, ZnO and CdS have been found suitable for surface acoustic wave generation and propagating to varying degrees.

Several properties that are often found in boules of substrate material can prevent the achievement of desired electrical performance in a manufactured SAW device. A particularly frustrating aspect of these properties is that heretofore manufacturing experience and fabricated device performance were alone the only available tools for predicting absence of these properties and satisfactory electrical performance is subsequently manufactured devices.

Figure 1:
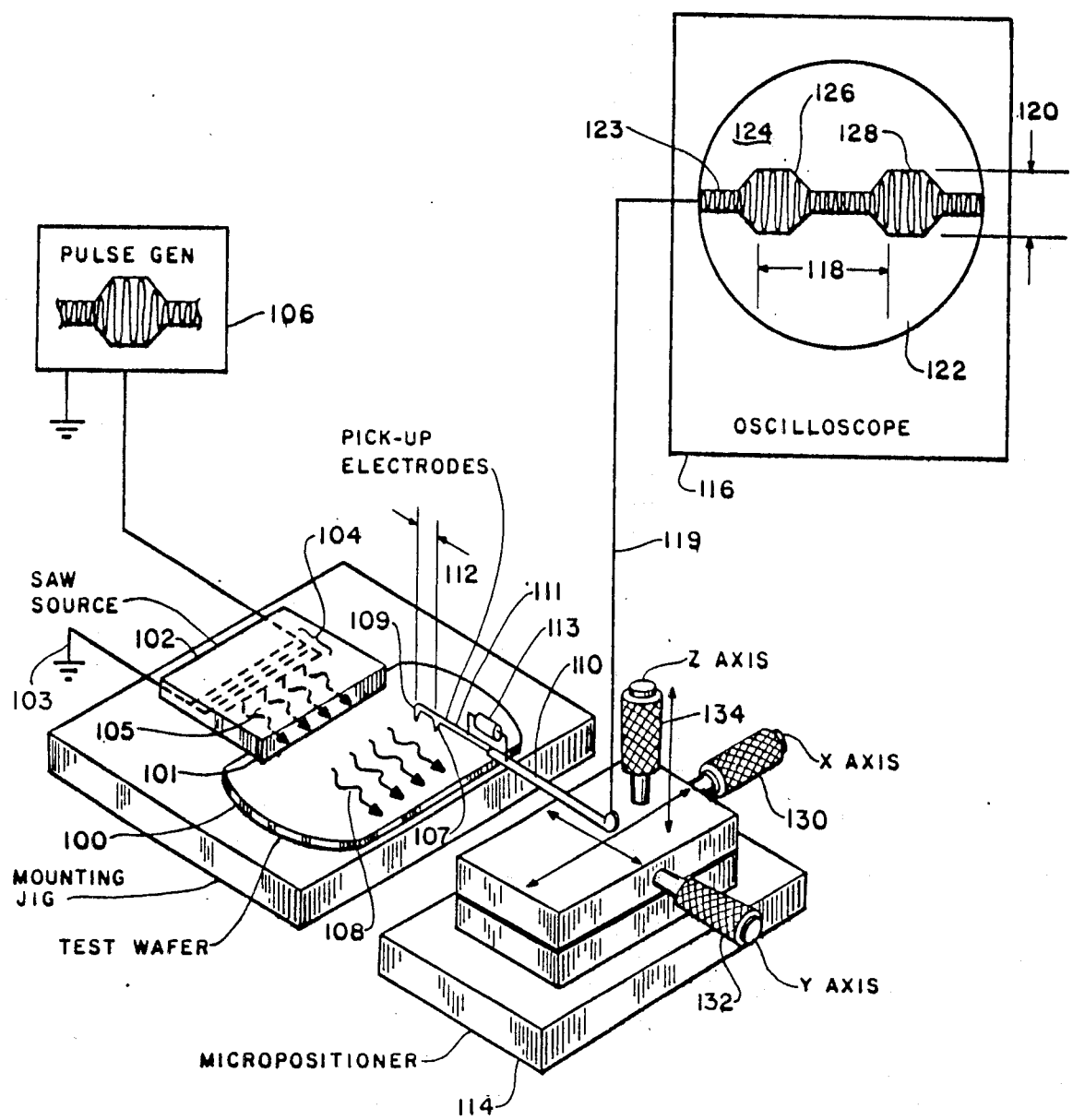
FIG. 1 shows an apparatus and method for conducting one family of tests for the selection of piezoelectric substrate materials.

FIG. 1 of the drawings illustrates a testing arrangement which can quickly and conveniently overcome much of this manufacturing difficulty. In FIG. 1, there is shown a test wafer 100 of piezoelectric material, such as lithium niobate, which is excited from an electrical source such as the pulse generator 106. This excitation produces the surface acoustic waves indicated generally at 108 and provides an electrical signal output by way of a probe 110 to a measuring or viewing apparatus, such as the oscilloscope 116. The FIG. 1 apparatus includes an arrangement, such as the micropositioner 114, for locating the probe 110 at selected points along and across the wafer 100. Positioning occurs in response to the manipulation of X, Y and Z axis controls, which are generally indicated at 130, 132, and 134. The controls 130-134 may, of course, be driven by electric motors under the control of a computer if desired for a large quantity testing embodiment of the FIG. 1 apparatus.

The probe 110 is shown to include two pickup electrodes 107 and 109 which are spaced by some predetermined distance 112 as is described below. A greater number of pickup electrodes can be employed if desired.

A transducer device 102, which includes a comb arranged array of electrodes 104 located on its underside, is shown to be coupled to the test wafer 100 in FIG. 1. The transducer 102 serves to transfer energy from the pulse generator 106 to the test wafer 100.

The oscilloscope 116 in FIG. 1 is assumed to include suitable signal amplifiers and trace controlling time base generators for producing an amplitude versus time display of the signal received from the probe 110. The oscilloscope 116 may be replaced by automated or computer controlled electronic circuitry capable of performing the required time and amplitude discriminating functions in a high-speed, large volume embodiment of the FIG. 1 apparatus.

The FIG. 1 apparatus contemplates improving over the present practices in the piezoelectric art by inter alia adding the transducer device 102 to the piezoelectric test arrangement. The transducer 102 allows the introduction of surface acoustic waves, as indicated at 108, to a test wafer sample in a manner which is convenient, repeatable, quickly set up, and low in cost. A particular advantage of using the transducer 102 in the FIG. 1 apparatus is the elimination of need for fabricating a deposited metal electrode array such as the array 104 on each tested wafer in a manufacturing environment.

The FIG. 1 apparatus contemplates that surface acoustic wave energy from the transducer 102 is coupled to the test wafer 100 by way of a liquid coupling medium, such as deionized water. This coupling reduces the losses attending energy transfer between the transducer and the test wafer.

Electrical signals produced by piezoeletric action of the surface acoustic wave 108 in FIG. 1 are sensed by the electrodes 107 and 109 on the probe 110. The electrodes 107 and 109 are electrically connected in parallel and produce signals which are coupled to the oscilloscope 116 by way of a coaxial cable which is generally indicated at 119; the coaxial cable is terminated in its characteristic impedance by the resistor 113 located near the probe electrodes.

The pulse generator 106 in FIG. 1 is contemplated to be of the radio frequency carrier, amplitude modulated type and is to provide an amplitude modulation pulse imposed on the radio frequency carrier signal. The radio frequency of the pulse generator 106 is selected to be compatible with the transducer 102 and the test wafer 100, generally frequencies in the range of 50 to 300 megahertz are acceptable for this purpose.

The probe electrodes 107 and 109 in FIG. 1 may be fabricated from any suitable material, such as stainless steel. The signal produced at the two probe electrodes is shown generally at 124 in FIG. 1, and includes a constant amplitude carrier portion 123 and two increased amplitude portions 126 and 128 which represent the arrival of a pulse from the generator 106 at each of the probe electrodes 109 and 107.

The time delay 118 between the arrival of a pulse at the two probe electrodes 107 and 109 is proportional to the spacing 112 between the probe electrodes 107 and 109 and also to the propagation velocity of the surface acoustic wave 108 across the test wafer 100. Knowledge of the characteristic propagation time of surface acoustic waves in a particular type of wafer material can be used to verify the correct functioning of the FIG. 1 apparatus and the proper orientation of the test wafer 100 with respect to the transducer 102 and the probe electrodes 107 and 109.

The orientation of a signal propagation path with the crystal lattice and domain structure of a substrate material is found to be quite sensitive and requiring of careful consideratin in a SAW device manufacturing process. For example, it is common practice in the fabrication of lithium niobate delay lines to control the orientation of wafer samples within ±30 minutes of arc over the wafer normal Y axis and ±10 minutes of arc along the Z propagation axis to achieve desirable delay line performance. Apparatus for changing relative orientation of the transducer 102, the sample 100 and the probe 110 is not shown in FIG. 1 but can be added conveniently. With the addition of such apparatus, the properties of the signal 124 may be used to search for the most optimum orientation of the sample, probe and transducer.

The signal received at the oscilloscope 116 in FIG. 1 is, of course, much reduced from that provided by the pulse generator 106 because of losses experienced along the SAW signal path. It is found, for example, that an overall insertion loss of 90-94 decibels (dB) is to be expected between the signal level at the pulse generator 106 and the signal coupled to the oscilloscope 116. This insertion loss of approximately 90 dB includes components occurring at the liquid interface 101, at the interface between the surface acoustic wave 108 and the probe electrodes 107 and 109, and between the electrical signals from the pulse generator 106 and the surface acoustic wave 105 within the transducer 102.

The component of these losses in the transducer 102 may be measured experimentally by a procedure which involves coupling surface acoustic waves between two identical transducers of the type shown at 102. For this measurement the transducers are located on a single substrate and assigned one-half of the total measured insertion loss each. By this method, it is found that transducers of the type to be described below produce insertion losses of 6 dB each, a total of twelve dB being observed between the input and output signal of the single substrate mounted pair. The above identified Ono patent discusses the coupling of SAW energy between different propagating materials and is hereby incorporated by reference.

The loss occurring at the probe electrodes 107 and 109 may be measured once the 6 dB transducer loss is known by placing probe electrodes on the surface of the transducer structure itself or in other words on the surface of the two transducer test device described above—at a location between the input and output transducers. By this measurement, it is found that probe detection losses are in the neighborhood of 75 dB. Loss at the liquid interface 101 is found to be approximately 10 dB. The total insertion loss, therefore, between the signal generator 106 and the signal coupled to the oscilloscope 116 is 91 dB. With two probe electrodes as shown in FIG. 1, this insertion loss is found to be 92 and 94 dB.

The transducers 102 employed in the preferred embodiment of the invention and in performing the preceding measurements of insertion loss are composed of ten electrode pairs, that is, 10 electrode fingers connected to the pulse generator 106 and ten electrode fingers connected to the ground terminal 103 and are found to have a center frequency of 57 megahertz. This transducer also has an aperture width of 0.45 inch and an electrical impedance measured at 57 megahertz of 31−j14 ohms. Other transducer arrangements and other transducer characteristics could, of course, be employed.

The difference between a desirable test wafer 100 and an undesirable wafer which has incomplete poling, crystal strains, inclusions, surface defects, or orientation deficiencies, will be manifest in both the amplitude 120 and delay time 118 for the signal 124. A deviation in either the delay time or the amplitude or the total absence of a signal at the oscilloscope 116 is therefore interpreted as reason for rejecting the wafer under test. A typical value of time delay for probes separated by 0.5 inch for a Z propagating lithium niobate wafer is 3.6 microseconds. The expected amplitude for the probe detected signal can be computed knowing the 90 dB insertion loss and the amplitude of the pulse generator signal.

It may occur that good and bad areas can exist on a single piezoelectric wafer; in such event, locating the probe 110 on one portion of a test wafer produces the desired time and amplitude indications on the oscilloscope 116 while other locations provide signals of incorrect time and amplitude. These good and bad areas may be marked for later segregation when the wafer is divided by sawing or scribing or other techniques known in the art.

The FIG. 1 arrangement for probing for the electric field associated with a surface acoustic wave provides a quick and nondestructive means for directly evaluating the properties of a test wafer that are important in the subsequent fabrication of a surface acoustic wave device. The FIG. 1 test can be extended to include an array of probe electrodes rather than the two electrodes shown and could also include a separate package of electronic discriminating circuitry connected to each electrode. The FIG. 1 test can be applied in a low-throughput environment by marking the desired time and amplitude waveforms in grease pencil or other marking arrangements directly on the face of the oscilloscope screen 122. In environments requiring a larger throughput, the oscilloscope 116 could be replaced with electronic circuitry or a programmed digital computer capable of discriminating between the expected and improper waveforms. The FIG. 1 probing test is accomplished at the wafer level of manufacturing and may be used on either a sampling or a 100% inspection basis as desired; the sampling of at least one wafer from each boule is a probable minimum use of the FIG. 1 test in a manufacturing environment.

It should be noted that the FIG. 1 test can be accomplished on an unprocessed polished wafer surface and that this arrangement additionally increases the desirability of such a test since the further processing of polished wafers which prove to be unacceptable is eliminated.

The importance of adequate electrical poling and freedom from crystal stress and strain inperfections is sufficient to warrant the use of material screening tests at the boule level in addition to the wafer level probing test of FIG. 1. Additional tests usable at both the boule and wafer level are described herein and may be combined as needed with the probing test for complete evaluation of a piezoelectric boule. A boule level test for use in this combination is shown in FIG. 2 of the drawings.

Figure 2:
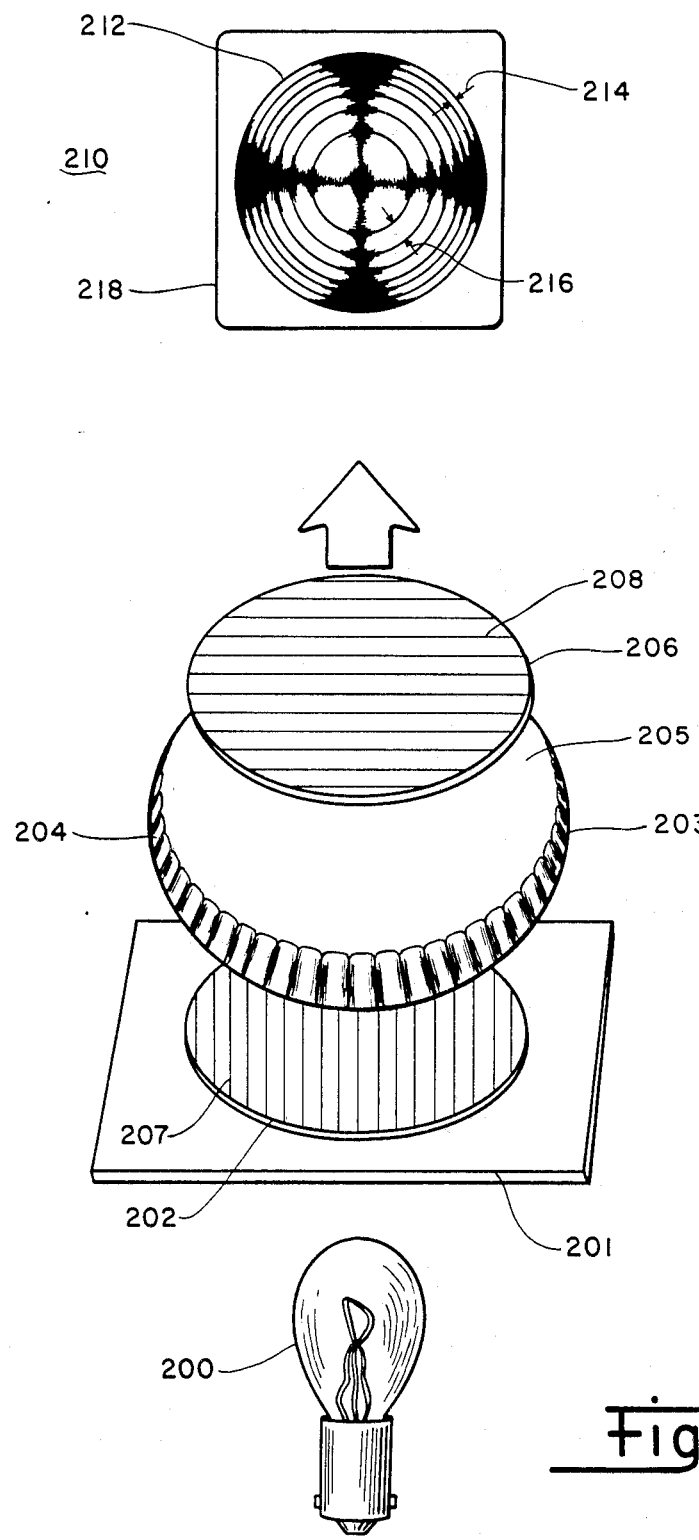
FIG. 2 shows apparatus capable of performing a second selection test for piezoelectric substrate materials.

In FIG. 2, a boule to be tested 204 is shown to be located between two light-polarizing lenses 202 and 206. Light for illuminating the boule 204 is provided by an incandescent source 200 which is disposed below a ground-glass diffuser 201. The image produced by the FIG. 1 test is illustrated at 210 and is suitable for viewing by the unaided eye. The FIG. 2 test operates on the principle of light passing through a boule of piezoelectric material receiving a different degree of rotation according to the poling and strain and inclusion properties existing in the boule under observation.

The light source 200 in FIG. 2 may be any convenient incandescent lamp in the range of 10 to 20 watts, a 6-volt microscope illuminating lamp, for example, is well suited to this purpose. The polarizing lenses 202 and 206 are disposed coaxially with respect to each other and with respect to the boule under examination 204; the polarization of the two lenses 202 and 206 is at 90° with respect to each other as indicated by the simulated polarizing lines 207 and 208, respectively.

The boule 204 is provided with optically flat polished and parallel surfaces 203 and 205 and is to be mounted or held manually or rested on a glass such as an inverted pitri dish so as to be moveable between the polarizing lenses 202 and 206. The ability to rotate the boule 204 is desired, as is the ability to move the boule laterally and axially; these movement and rotation capabilities may be also provided by suitable mechanical apparatus which is not shown in FIG. 2.

The light image observed by a viewer using the FIG. 2 apparatus is shown at 210 and includes an interference pattern containing a characteristic arrangement of concentric circles and a circle centered cross. The image at 210 may also be described as a set of annular rings and a brush pattern, the annular rings having increasing separation toward the center of the pattern, and the brush or cross having narrowing arms as the center or axis of the image is approached.

The illustrated image 210 is representative of a satisfactory boule of piezoelectric material, that is, a boule having complete electrical poling and substantial freedom from crystal strains, inclusions, and surface defects. The image or view 210 is found to be totally absent for an unpoled boule of lithium niobate material, for example, and is found to appear in distorted from when stresses are present in the boule 204. The annular rings or circles 212, in particular, are found to distort into the form of ellipses when stresses are present in the boule 204. Movement of the boule 204 up and down along the axis of the polarizing lenses 202 and 206 is found to produce distorted dark rings in lieu of the annular or circular pattern shown at 212 when the boule 204 contains strains and inclusions. Inclusions such as bubbles act as light-scattering centers in the boule to produce this distortion of image 210.

A boule in the form of a 1-inch cube has also been found satisfactory for use in the FIG. 2 test. For a sample of this size, polarizing lenses of 2-inch diameter are found to be satisfactory. Larger lenses and larger boule samples could, of course, be employed in the FIG. 2 test if desired.

The Y axis oriented lithium niobate having Z end surfaces polished and parallel has been found to provide the results shown in the FIG. 2 test.

Additional tests indicating the degree of poling achieved in a piezoelectric crystal such as lithium niobate may be accomplished with the aid of a microscope. One of these additional tests involves backlighting a polished surface wafer of the piezoelectric material while examining the front surface of the wafer for the presence of distinguishable features. In this test, poled crystals have a very uniform transparent appearance while unpoled crystals shown small irregular variations in light intensity. These variations are associated with the randomly aligned electric domain structure of the unpoled crystal. It should be noted that backlighting and transmission of light through the crystal being examined are requirements of this poling test, and that examination of light reflecting from the front surface of a wafer is inconclusive of the achieved degree of poling. It is also to be noted that a wafer with a rough or ground texture back surface scatters the transmitted light significantly so that a satisfactory determination of poling cannot be made.

Another microscope test for the achieved degree of poling involves etching the surfaces of the polished wafer in a mixture of hydrofluoric and nitric acids, one part hydrofluoric and two parts nitric, for about one-half hour. An examination of the reflected light patterns from an etched wafer surface with a microscope magnification of about 90X shows that a depoled wafer is characterized by irregularly shaped patterns of light and dark area which are about equal in total area. At higher magnification power, the dark regions in this image are found to include small etch pits which are pyramidal in shape. The average etch pit size is on the order of 2 to 3 micrometers. The clear areas in this image show some effects of the etch but are free of the distinctive pit patterns. The tops of the pyramidal etch pits are at the same level as the smoother surface. The etch patterns appear to be indicative of two different domain orientations.

In the case of a poled crystal subjected to the two-acid etch, different patterns are observed on the negative and positive polarity surfaces of a sample—the negative polarity surface receives small etch pits and has a uniform textured appearing surface while the positive surface remains relatively smooth. The negative polarity surface is found to etch considerably faster at first in the acid etch procedure than does the positive polarity surface. The etch test for satisfactory poling is destructive in nature and requires a significant period of time for accomplishment; it is, nevertheless, a viable and conclusive indication of the achieved degree of poling in a piezoelectric wafer sample such as lithium niobate.

While the apparatus and method herein described constitute a preferred embodiment of the invention, it is to be understood that the invention is not limited to this precise form of apparatus or method and that changes may be made therein without departing from the scope of the invention which is defined in the appended claims.

We claim:

1. A method for testing a wafer of piezoelectric material for utility in a surface acoustic wave transducer device comprising the steps of:
    applying acoustic energy excitation to a first surface region of said wafer;
    measuring electrical signals at a pair of sample points located along a propagation path of said acoustic energy transverse of said wafer;
    comparing said electrical signals with predetermined values of acceptable electrical signals.

2. The method of claim 1 wherein said step of comparing electrical signals includes comparing the amplitude of said electrical signals with predetermined amplitude values.

3. The method of claim 1 wherein said step of comparing electrical signals includes comparing the delay timing of said signals with predetermined delay values.

4. The method of claim 1 further including the step of reorienting the relationship of said first region and said sample points with respect to said wafer.

5. The method of claim 4 further including the step of reorienting said relationship until electrical signal values in two predetermined ranges are obtained.

6. A method for testing a boule of piezoelectric material for usability in a surface acoustic wave transducer device comprising the steps of:
    measuring the attained degree of domain poling in a wafer sample from said boule with respect to a predetermined minimum acceptable poling degree; and
    comparing the residual mechanical stress in a wafer sample from said boule material with a predetermined acceptable degree of residual stress.

7. The method of claim 6 wherein said step of measuring the degree of poling includes at least one of the steps of:
    comparing the electrical signals from an array of points located along the path of a propagating acoutic signal in a wafer sample of said boule material with a predetermined array of signal values; and
    assuring the presence of a poled state concentric ring and cross interference pattern in polarized light transmitted through a sample of said material.

8. The method of claim 7 wherein said step of comparing electrical signals includes amplitude comparison with said signal value array; and
    wherein said assuring step includes placing said wafer sample between ninety degree oriented light polarizers.

9. The method of claim 7 wherein said step of comparing electrical signals includes time delay comparison with said signal value array.

10. A method for evaluating the suitability of a piezoelectric material crystal for use in a surface acoustic wave device comprising the steps of:
    removing a parallel faced and polished facial surface sample from said crystal;
    illuminating one face of said sample with polarized light;
    viewing an image comprised of light transmitted through said sample using viewing polarization coaxial with said polarized light and rotated ninety degrees with respect to said light;
    assuring the presence of a predetermined light interference pattern in said viewed image.

11. The method of claim 10 wherein said predetermined interference pattern includes a concentric and symmetric annular ring and cross interference pattern.

12. The method of claim 11 wherein said assuring step includes rejecting samples producing no interference pattern and samples producing an interference pattern exceeding a predetermined degree of distortion in said annular ring and cross pattern.

13. The method of claim 12 wherein said sample is Y axis oriented with parallel Z end surfaces.

14. A method for testing a boule of lithium niobate material for useability in a surface acoustic wave delay line comprising the steps of:
applying mechanical energy acoustic wave excitation near the edge of a sample wafer of said lithium niobate material;
measuring the amplitude and delay times of electrical signals from a plurality of simultaneously accessed sample points located along a selected propagation path of said acoustic wave energy across said wafer;
comparing said electrical signal amplitude and delay times with predetermined acceptable values therefor;
rejecting boules of said lithium niobate material producing amplitude and delay time values outside a predetermined range from said acceptable values;
illuminating one surface of a polished parallel surface transparent second sample wafer of said lithium niobate material with polarized light coaxially disposed with respect to said transparent sample;
viewing the light transmitted through said second transparent sample with a viewing polarizer coaxially disposed at ninety degrees with respect to said polarized light;
rejecting boules providing second transparent sample transmitted light that is devoid of a concentric ring and ring-centered-cross interference pattern and boules providing images of said pattern exceeding a predetermined degree of distortion.

15. Apparatus for testing a wafer of piezoelectric material for satisfactory performance capability in a surface acoustic wave transducer device comprising the combination of:
acoustic transducer means for applying surface accoustic energy excitation to a first surface area of said wafer;
electrode means for sampling a plurality of electrical signals from a plurality of sample points located along a propagation path of said surface acoustic energy transverse of said wafer;
means for comparing said sample points electrical signals with predetermined acceptable signal values.

16. The apparatus of claim 15 further including fluid means for improving the coupling of energy from said acoustic transducer means to said wafer.

17. The apparatus of claim 16 wherein said fluid means includes liquid water.

18. The apparatus of claim 17 wherein said means for comparing electrical signals includes amplitude comparison means.

19. The apparatus of claim 18 wherein said means for comparing electrical signals includes signal delay comparison means.

20. The apparatus of claim 15 wherein said plurality of electrical signals is comprised of two electrical signals.

* * * * *